United States Patent [19]

Fottler

[11] Patent Number: 4,857,988
[45] Date of Patent: Aug. 15, 1989

[54] LEADLESS CERAMIC CHIP CARRIER

[76] Inventor: Stanley A. Fottler, 14 Bicentennial Dr., Lexington, Mass. 02173

[21] Appl. No.: 153,979

[22] Filed: Feb. 9, 1988

[51] Int. Cl.⁴ .................. H01L 39/02; H01L 23/02; H01L 23/12; H01L 29/44
[52] U.S. Cl. ........................... 357/74; 357/80; 357/68
[58] Field of Search ................ 357/80, 74, 68

[56] References Cited

U.S. PATENT DOCUMENTS

| | | |
|---|---|---|
| 3,271,507 | 9/1966 | Elliott et al. . |
| 3,404,214 | 10/1968 | Elliott ............................. 357/80 |
| 3,509,430 | 4/1970 | Mroz et al. . |
| 3,520,054 | 7/1970 | Pensack et al. . |
| 4,076,955 | 2/1978 | Gates, Jr. ........................ 357/74 |
| 4,445,274 | 5/1984 | Suzuki et al. .................... 29/832 |
| 4,626,960 | 12/1986 | Hamano et al. ................ 361/388 |

OTHER PUBLICATIONS

S. A. Fottler, Transistor Cup-Mount Package, Electric Component Conference 1968.

Primary Examiner—Eugene R. LaRoche
Assistant Examiner—Michael B. Shingleton
Attorney, Agent, or Firm—Hamilton, Brook, Smith & Reynolds

[57] ABSTRACT

A semiconductor chip carrier having a ceramic base with a cavity for carrying a semiconductor chip and a cap for sealing the chip within the cavity. The base has a metallization pattern covering the chip contacts on the base and an outer contact castellated ring providing for the flow of excess solder away from the contact area.

13 Claims, 3 Drawing Sheets

LEADLESS CERAMIC CHIP CARRIER

BACKGROUND

The present invention relates to a chip carrier device, and more particularly, to a semiconductor device including a semiconductor chip positioned within a cavity of a leadless ceramic base, and a cap for sealing the chip within the cavity.

Devices for housing semiconductor chips have been developed wherein an integrated circuit chip, for example, is placed on a leaded frame or in a cavity with a leaded or leadless base and sealed with a cap. These caps have generally been made of metal for reasons of workability, solderability, cost, etc. U.S. Pat. No. 4,445,274 discloses a mount for electronic components wherein the cap is either ceramic or metal, and is sealed with glass having a low-melting point.

In a chip carrier device incorporating base, leads, and a ceramic cap, the cap may be bonded to the base by metallizing the two in the regions of contact and soldering them in the metallized regions. Soldering is carried out by inserting a thin preformed solder ring between the ceramic base and cap, melting the solder while simultaneously pressing the cap against the base, and then cooling to solidify the solder. The pressing of the cap is required to prevent formation of voids in the soldering portion between the base and the cap since a ceramic cap is often somewhat warped.

One problem associated with soldered caps is that excess solder flows from the heated seal into the cavity of the base and outside the cap, resulting in possible short-circuits or solder particles inside with the semiconductor device. The presence of solder flux within the sealed cavity can result in corrosion of the cavity contents.

The U.S. Pat. No. 4,626,960 discloses a semiconductor device comprised of a ceramic body with a semiconductor chip mounted thereon and a ceramic cap sealed to the ceramic body with solder. This device incorporated a soldered ceramic cap wherein excess solder is retained by a metallized side wall of the ceramic cap.

The insulating base and the insulating cap of this device have patterns of metallization in areas of contact between these components. The pattern of metallization of the insulating cap extends from the area of contact with the base to the side surfaces of the insulating cap. The insulating base and insulating cap are soldered to each other in the areas of the patterns of metallization. However, this device utilizes leads which increases the cost and complexity of the device. The base has a layered structure to provide for the connection of the leads to the chip within the base. For semiconductor devices in which leads are provided on one side of the base, provision for a heat sink at the rear of the base is often not possible. Another problem is that devices are often mounted close to the board making it difficult to remove excess solder and flux around the leads.

SUMMARY OF THE INVENTION

A circular semiconductor chip carrier is claimed having a peripheral castellated contact ring and a cap to provide a hermetic seal about the chip. The carrier utilizes leadless metallized fingers extending from the castellated ring, through the seal to a contact ring adjacent the chip.

The castellated structure provides for the mounting of the carrier package onto a printed circuit board or other substrates where the main body is spaced above the board so that excess solder and flux material can be washed from underneath the carrier.

The invention is comprised of elements that greatly enhance the ease of fabrication of the package. The ceramic base is made by a single step mold. A cavity is formed in one side of the base such that a chip can be secured to a lower surface within the cavity. An inner wall of the cavity has a pair of annular steps. The first step providing contact points for electrical connections to the chip and the second step providing a platform for a hermetic seal to the cap. The outer wall on the side opposite the cavity is provided with a groove on one portion so that the carrier package can be uniquely oriented by a vibratory bowl feeder during assembly, testing, and attachment to its substrate.

The base material is fired and then masked to expose areas within the cavity for metallization. These metallized fingers extend from the lower surface and the first annular step, up the inner wall, and through the seal to the top of the upper castellated ring.

A low temperature glass is deposited in a peripheral ring on one side of the cap before the cap is placed on the second annular step. This glass is inductively heated to form a hermetic seal between the ceramic cap and the second step.

The above and other features of the invention including various novel details of construction and combinations of parts will now be more particularly described with reference to the accompanying drawings and pointed out in the claims. It will be understood that the particular chip carrier device embodying the invention is shown by way of illustration only and not as a limitation of the invention. The principles and features of this invention may be employed in varied and numerous embodiments without departing from the scope of the invention.

DESCRIPTION OF THE PREFERRED EMBODIMENTS

Figure 1:
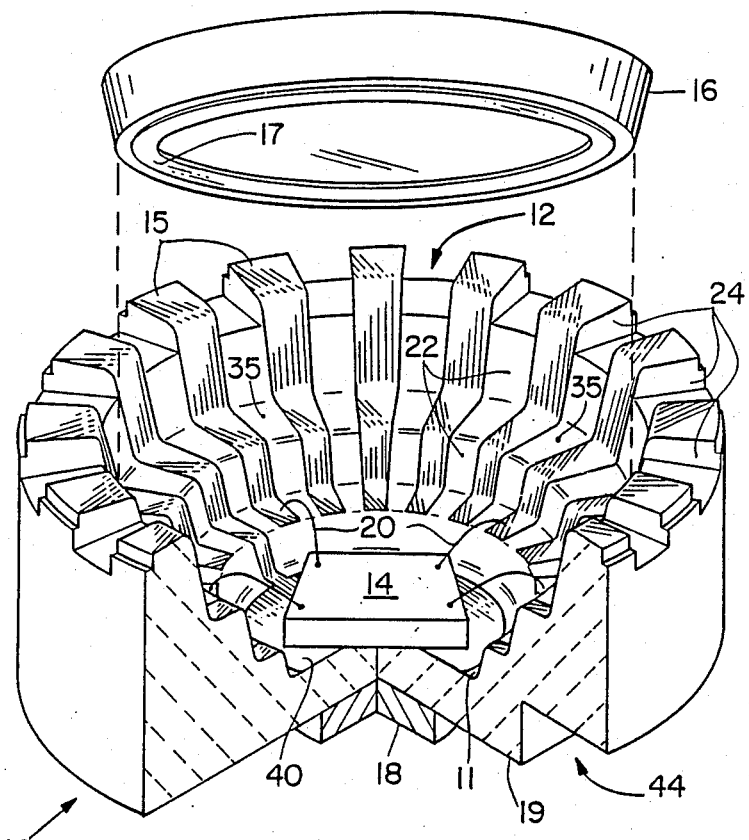
FIG. 1 is a partially sectioned perspective view of a ceramic chip carrier according to the invention.

FIG. 1 illustrates a preferred embodiment of a semiconductor device according to the present invention. In describing the device construction, the "floor" of the cavity is considered as the deepest part of the cavity opening in the base. The "top" of the base is that side opposite the cavity floor.

The semiconductor device comprises a ceramic base 10 having a cavity 12, a semiconductor chip 14 mounted onto the floor 11 of the cavity 12. A plurality of conductive fingers 15 are formed by a metallization process described below.

The cavity 12 is open prior to the insertion and securing of the chip, and the sealing of a ceramic cap 16 to the base 10 to cover the cavity 12.

The ceramic base is comprised of thermally conductive and electrically insulating material such as alumina. The semiconductor chip 14 is mounted onto a metallized surface 40 which is formed on the floor 11 of the base 10. The semiconductor chip 14 is electrically connected to the metallized fingers 15 by means of fine wires 20 which are comprised of gold or aluminum, for example. The fine wires are bonded to each of the metallized fingers 15 and to each of terminals of the semiconductor chip 14. The metallized fingers 15 in the base extend up along the inner wall 22 of the cavity 12 to the castellations 24 on the top of the base which form a castellated ring structure.

A conventional heat sink 18 is provided on the base 10, on the side opposite the cap 16, for cooling of the component during operation. The heat sink 18 can be any of a number of well known designs and is added after molding of the base 10.

A groove 44 is formed on the bottom 19 of the base 10 during the molding thereof. The groove 44 extends across an edge portion of the base 10 to provide for the unique orientation of the base 10 during subsequent assembly. A vibratory bowl feeder may thereby be utilized in orienting the device using a ledge that mates with the groove 44.

Figure 2:
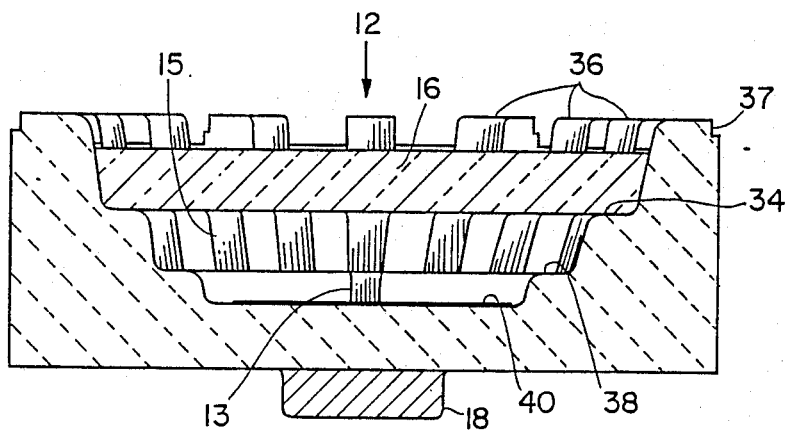
FIG. 2 is a sectional view of the device illustrated in FIG. 1 with the chip removed and with the cap in a sealed position.
Figure 3:
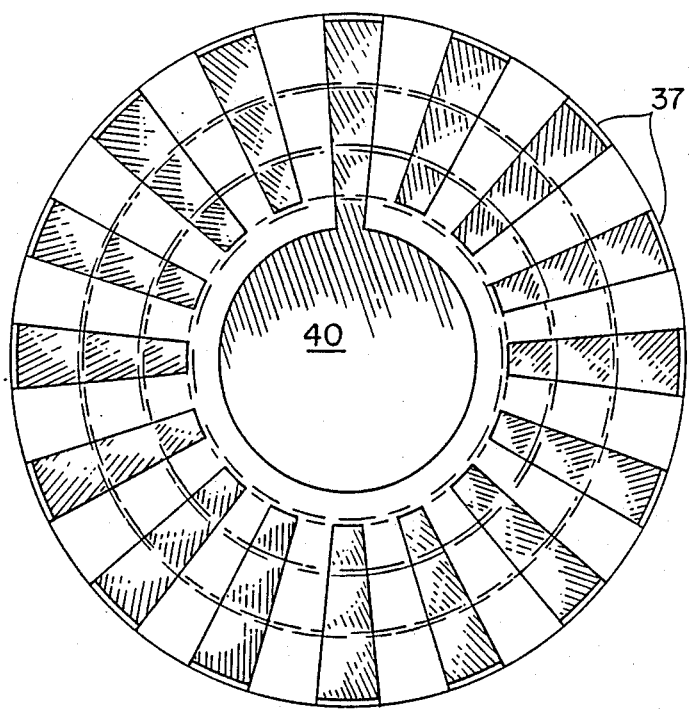
FIG. 3 is a plan view of the ceramic base in FIG. 1 without the chip or the cap.

The sectional and plan views of the carrier structure shown in FIGS. 2 and 3 without the chip serve to further clarify the invention.

FIG. 2 illustrates that the cap 16 is sealed to the base 10 on an upper flat annular step 34 below the top surfaces 36.

All of the metallized fingers 15 except for finger 13 extend from the surfaces 36 to the lower annular step 38. Finger 13 extends from a top surface 36 to the lower metallized surface 40 which is clearly depicted in the plan view of FIG. 3. The surface 40 serves the chip mounting pad and can be used, for exmaple, to ground the chip.

The castellated ring structure is comprised of a plurality of castellations 24 each having a top surface 36. When the device is mounted on a printed circuit board or substrate for a particular application, the bulk of the device is elevated above the board to permit easy cleaning of the excess solder and flux to avoid short circuiting of adjacent contacts. Small fillets 37 can be located on the outer peripheral edge of each castellated structure to provide for a solder fillet during surface mount assembly.

Figure 4:
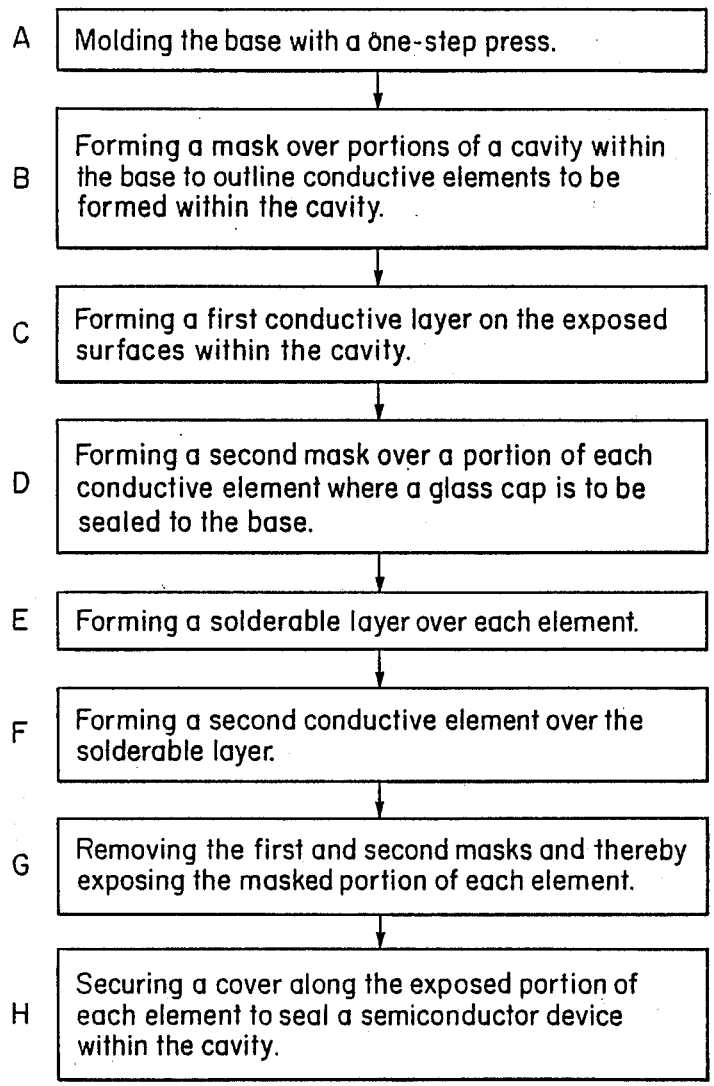
FIG. 4 (A-H) is a process flow diagram illustrating the fabrication steps in the formation of the leadless chip carrier of the present invention.

The details of the fabrication procedure for the chip carrier device of the present invention are shown in the process flow diagram of FIG. 4.

First (A in FIG. 4), a ceramic powder is placed in a preformed mold, pressure is applied, and the molded ceramic part is then fired. Firing of the molded base results in the sintering of the ceramic. The molded base is removed and a series of steps are performed to provide for electrical connections between the chip to be placed on the floor 11 and the outer legs.

Each metallization pattern 15 is formed of three layers outside of the shelf area 34 where the cap 16 is sealed to the base 10. The first layer is formed by placing the base in a preformed metal mask or other standard mask (B in FIG. 4) within the cavity outlining the element areas 15. A first conductive layer (C in FIG. 4) is formed on the cavity side of the base 10 including the top 36 of the castellated structure. This layer provides good adhesion to the base and provides conduction through the seal 34 between the cap and the base. The layer is preferably formed with electron-beam deposited refractory metals, such as tungsten or titanium/tungsten alloys.

Those portions of the metallized elements 15 where the cap 16 is to be sealed to the base 10 is covered with a second mask (D in FIG. 4), preferably comprising a polymeric material. This second mask partially covers the shelf area 35. A layer of solderable material such as nickel is then formed, preferably by an electroplating procedure (E in FIG. 4) over each 15 element followed by a conductive metal top layer (F in FIG. 4) such as gold. The first mask and the second polymeric mask are then removed (G in FIG. 4). This exposes that portion of each conductive element 15 on shelf 35 that had been covered by the polymeric mask so that the cap 16 can be sealed (H in FIG. 4) to the base on shelf 35.

A low temperature glass ring 17 is positioned between the bottom of cap 16 and the shelf 35 to form a seal 34 between the cap and the base. The ring 17 is heated so that it is melted to form a hermetic seal. The ring 17 is preferably a glass that melts between 400° and 600° C. and can be melted by placing a heated element on the opposite side of the cap 16 to locally heat the ring 17.

The bottom surface 19 of the base 10 can then be adapted to receive a heat sink to provide thermal dissipation from the base 10 in the vicinity of the chip 14.

The chip carrier device is then ready to be mounted by soldering the tops 36 of the castellations 24 to any mounting surface.

I claim:

1. A circular semiconductor chip carrying device comprising:
    a circular ceramic insulating base having a cavity for carrying a semiconductor chip;
    an insulating cap covering and sealing the chip within the cavity;
    a circular floor within the cavity of said insulating base to which the chip is secured;
    a contact surface configured about the chip along a peripheral wall of the cavity;
    a sealing surface along the peripheral wall to which the insulating cap is hermetically sealed, the sealing surface being further removed from the floor and the contact surface such that the contact surface is completely enclosed when the insulating cap is sealed to the sealing surface of the cavity;
    a plurality of spaced castellations outside of the sealed cavity and extending from the peripheral wall of the cavity;
    a plurality of continuous conductive regions extending from each castellation along the peripheral wall to the contact surface; and
    a conductive layer on the floor of the cavity contacting one of said conductive regions.

2. The chip carrying device of claim 1 further comprising sealing means for hermetically sealing the cap to the sealing surface.

3. The chip carrying device of claim 1 wherein said circular insulating base is further comprised of an outer wall with upper peripheral edge along said castellated ring, and a lower peripheral edge with a grooved portion such that said device can be uniquely oriented when said groove is mated with an external member.

4. The chip carrying device of claim 1 further comprising a plurality of contact elements for providing conductive contact between the chip and the conductive regions along the contact surface.

5. The chip carrying device of claim 1 wherein said insulating cap is comprised of a ceramic material.

6. The chip carrying device of claim 2 wherein said sealing means is comprised of a glass having a low melting temperature between 400° C. and 600° C.

7. The chip carrying device of claim 1 wherein the castellations have outer edges with grooves disposed along said edges such that the device can be secured to a support surface with fillets that are partially exposed in said groove.

8. The chip carrying device of claim 1 wherein the spacing between each adjacent castellation is such that solder and flux remaining after the soldering of each castellation to the support surface can be removed.

9. A housing for an electronic device comprising:
an insulating base having a cavity for housing an electronic device;
an insulating cap recessed within said insulating base and sealed to a sealing surface of the base such that the device is hermetically sealed within the cavity; and
a plurality of conductive regions extending along the sealing surface between the cap and the base such that leads from the device within the cavity are in conductive contact with a contact surface enclosed within the sealed cavity and can be conductively contacted outside the sealed cavity through the conductive regions, said conductive regions comprising a first conductive layer extending along the sealing surface to the contact surface; a solderable layer over the first conductive layer and not over the sealing surface; and a second conductive layer comprising a material different from the first layer that is positioned over the solderable layer.

10. The housing of claim 9 further comprising an outer peripheral wall and a fillet on an outer edge of the wall.

11. The housing of claim 9 wherein the device is mounted on a lower surface within the cavity comprised of a conductive layer in conductive contact with one of said conductive regions.

12. The housing of claim 9 further comprising a low temperature glass for sealing the cap to the base.

13. A housing for an electronic device comprising:
an insulating base having a cavity for housing an electronic device;
an annular contact surface to which the leads of the device are connected;
a second annular sealing surface spaced apart from the contact surface to which a cap recessed within said insulating base and is hermetically sealed to enclose the device in the cavity;
a plurality of external contact regions, each region spaced apart from the annular contact and sealing surfaces; and
a plurality of continuous contact regions extending from the external contact regions, along the annular sealing surface to the annular contact surface.

* * * * *